United States Patent
Huang

(10) Patent No.: US 11,410,944 B2
(45) Date of Patent: Aug. 9, 2022

(54) STACKED STRUCTURE, PACKAGE STRUCTURE AND METHOD FOR MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 83 days.

(21) Appl. No.: 16/557,993

(22) Filed: Aug. 30, 2019

(65) Prior Publication Data

US 2021/0066218 A1 Mar. 4, 2021

(51) Int. Cl.
| | |
|---|---|
| *H01L 23/31* | (2006.01) |
| *H01L 23/66* | (2006.01) |
| *H01L 23/498* | (2006.01) |
| *H01L 21/48* | (2006.01) |
| *H01Q 1/38* | (2006.01) |
| *H01L 23/00* | (2006.01) |

(52) U.S. Cl.
CPC .......... *H01L 23/66* (2013.01); *H01L 21/4857* (2013.01); *H01L 23/3128* (2013.01); *H01L 23/49822* (2013.01); *H01L 23/49838* (2013.01); *H01L 24/16* (2013.01); *H01Q 1/38* (2013.01); *H01L 2223/6677* (2013.01); *H01L 2224/16227* (2013.01)

(58) Field of Classification Search
None
See application file for complete search history.

(56) References Cited

U.S. PATENT DOCUMENTS

| 5,757,611 A | 5/1998 | Gurkovich et al. |
| 8,633,858 B2 | 1/2014 | Nair et al. |
| 2004/0251549 A1* | 12/2004 | Huang .............. H01L 21/76804 257/758 |

(Continued)

FOREIGN PATENT DOCUMENTS

CN 107959109 A 4/2018

OTHER PUBLICATIONS

Final Office Action for U.S. Appl. No. 16/557,992, dated Jan. 5, 2022, 15 pages.

(Continued)

*Primary Examiner* — Moin M Rahman
(74) *Attorney, Agent, or Firm* — Foley & Lardner LLP

(57) ABSTRACT

A stacked structure includes a lower structure and an upper structure. The lower structure includes at least one lower dielectric layer and at least one lower metal layer in contact with the lower dielectric layer. The upper structure includes at least one upper dielectric layer and at least one upper metal layer in contact with the upper dielectric layer. The upper dielectric layer includes a first upper dielectric layer attached to the lower structure. The first upper dielectric layer includes a first portion and a second portion. A difference between a thickness of the first portion and a thickness of the second portion is greater than a gap between a highest point of a top surface of the first upper dielectric layer and lowest point of the top surface of the first upper dielectric layer.

9 Claims, 11 Drawing Sheets

(56) References Cited

U.S. PATENT DOCUMENTS

| | | | |
|---|---|---|---|
| 2014/0027885 A1* | 1/2014 | Kawase | H01L 23/5329 |
| | | | 257/632 |
| 2017/0352666 A1* | 12/2017 | Ahn | H01L 27/10885 |
| 2018/0061805 A1* | 3/2018 | Fang | H01L 23/3114 |
| 2019/0006283 A1* | 1/2019 | Wang | H01L 21/76834 |
| 2019/0164912 A1* | 5/2019 | Lee | H01L 23/5389 |
| 2020/0105689 A1* | 4/2020 | Hwang | H01L 24/25 |

OTHER PUBLICATIONS

Non-Final Office Action for U.S. Appl. No. 16/557,992, dated Jun. 24, 2021, 15 pages.

\* cited by examiner

STACKED STRUCTURE, PACKAGE STRUCTURE AND METHOD FOR MANUFACTURING THE SAME

BACKGROUND

1. Field of the Disclosure

The present disclosure relates to a stacked structure, package structure and a manufacturing method, and to a package structure including the stacked structure and a method for manufacturing the stacked structure.

2. Description of the Related Art

A stacked semiconductor device package may include two stacked structures. The stacked structures are formed on both sides of a core substrate. Then, a semiconductor die is attached to one of the stacked structures. The dielectric layers of the two stacked structures may have the same material. Thus, a thickness of the dielectric layer may not be reduced efficiently due to the consideration of its material property such as dielectric constant (Dk). Accordingly, the total thickness of the stacked semiconductor device package may not be reduced efficiently.

SUMMARY

In some embodiments, a stacked structure includes a lower structure and an upper structure. The lower structure includes at least one lower dielectric layer and at least one lower metal layer in contact with the lower dielectric layer. The upper structure includes at least one upper dielectric layer and at least one upper metal layer in contact with the upper dielectric layer. The upper dielectric layer includes a first upper dielectric layer attached to the lower structure. The first upper dielectric layer includes a first portion and a second portion. A difference between a thickness of the first portion and a thickness of the second portion is greater than a gap between a highest point of a top surface of the first upper dielectric layer and lowest point of the top surface of the first upper dielectric layer.

In some embodiments, a package structure includes a lower structure, an upper structure, at least one semiconductor die and an encapsulant. The lower structure includes at least one lower dielectric layer and at least one lower metal layer in contact with the lower dielectric layer. The upper structure includes at least one upper dielectric layer and at least one upper metal layer in contact with the upper dielectric layer. The upper dielectric layer includes a first upper dielectric layer attached to the lower structure, and the first upper dielectric layer defines an indentation at a periphery thereof. The semiconductor die is electrically connected to the lower structure or the upper structure. The encapsulant covers the semiconductor die.

In some embodiments, a method for manufacturing a stacked structure includes (a) forming a lower structure, wherein the lower structure includes at least one lower dielectric layer and at least one lower metal layer in contact with the lower dielectric layer; (b) forming a first upper dielectric layer on the lower structure; and (c) pressing a portion of the first upper dielectric layer so as to form an indentation recessed from a top surface of the first upper dielectric layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
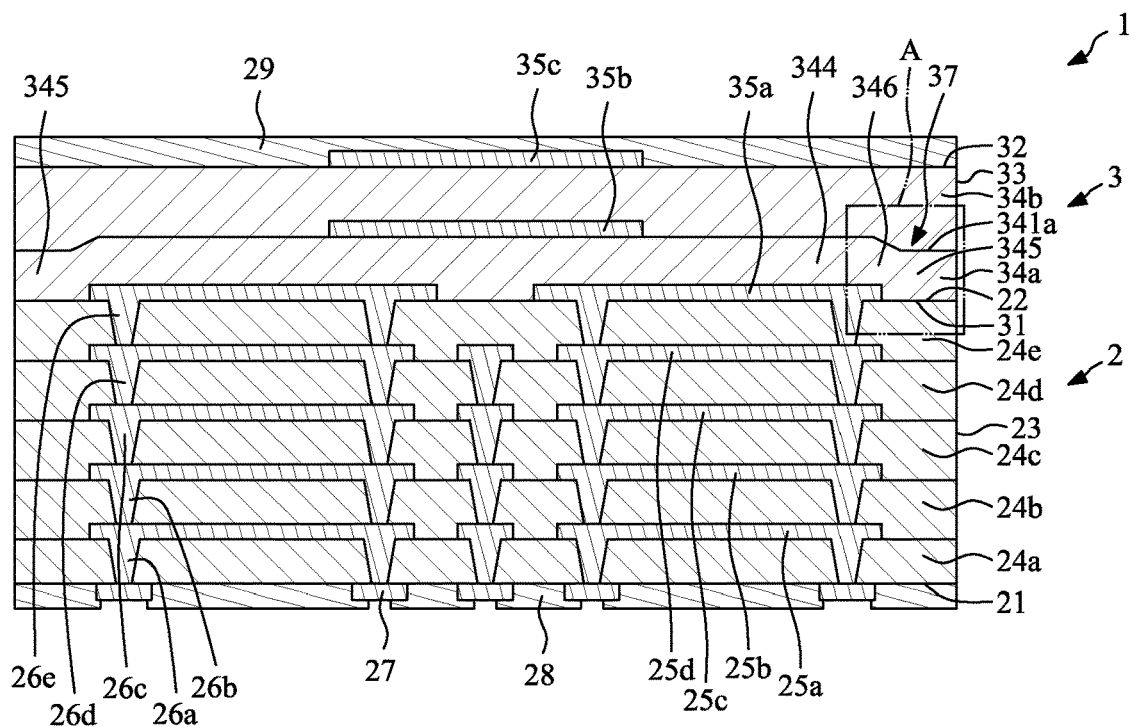
FIG. 1 illustrates a cross-sectional view of a stacked structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a stacked structure 1 according to some embodiments of the present disclosure. The stacked structure 1 includes a lower structure 2, an upper structure 3, a lower circuit layer 27, a lower protection layer 28 and an upper protection layer 29.

The lower structure 2 may be a routing structure, and has a first surface 21, a second surface 22 opposite to the first surface 21 and a lateral side surface 23 extending between the first surface 21 and the second surface 22. The lower structure 2 may include at least one lower dielectric layer (including, for example, a first lower dielectric layer 24a, a second lower dielectric layer 24b, a third lower dielectric layer 24c, a fourth lower dielectric layer 24d and a fifth lower dielectric layer 24e), at least one lower metal layer (including, for example, a first lower metal layer 25a, a second lower metal layer 25b, a third lower metal layer 25c, a fourth lower metal layer 25d) in contact with or interposed between the lower dielectric layers 24a, 24b, 24c, 24d, 24e, and a plurality of lower vias (including, for example, a first lower via 26a, a second lower via 26b, a third lower via 26c, a fourth lower via 26d and a fifth lower via 26e) embedded in the lower dielectric layers 24a, 24b, 24c, 24d, 24e.

In some embodiments, each of the lower dielectric layers (including, for example, the first lower dielectric layer 24a, the second lower dielectric layer 24b, the third lower dielectric layer 24c, the fourth lower dielectric layer 24d and the fifth lower dielectric layer 24e) may include, or be formed from, a photoresist layer, a passivation layer, a cured photo sensitive material, a cured photoimageable dielectric (PID) material such as epoxy, polypropylene (PP), or polyimide (PI) including photoinitiators, or a combination of two or more thereof. A dielectric constant (Dk) of each of the lower dielectric layers 24a, 24b, 24c, 24d, 24e may be 3.3 to 3.5. In some embodiments, each of the lower dielectric layers 24a, 24b, 24c, 24d, 24e may include fibers therein.

Each of the lower metal layers 25a, 25b, 25c, 25d includes a patterned circuit layer that may include a plurality of traces and a plurality of pads. The lower metal layers 25a, 25b, 25c, 25d are electrically connected to one another through the lower vias (including, for example, the first lower via 26a, the second lower via 26b, the third lower via 26c and the fourth lower via 26d). For example, the lower circuit layer 27 is disposed on the first surface 21 of the lower structure 2. The first lower metal layer 25a is disposed on the first lower dielectric layer 24a and electrically connected to the lower circuit layer 27 through the first lower via 26a. The second lower dielectric layer 24b is disposed on the first lower dielectric layer 24a to cover the first lower metal layer 25a. The second lower metal layer 25b is disposed on the second lower dielectric layer 24b and electrically connected to the first lower metal layer 25a through the second lower via 26b. The third lower dielectric layer 24c is disposed on the second lower dielectric layer 24b to cover the second lower metal layer 25b. The third lower metal layer 25c is disposed on the third lower dielectric layer 24c and electrically connected to the second lower metal layer 25b through the third lower via 26c. The fourth lower dielectric layer 24d is disposed on the third lower dielectric layer 24c to cover the third lower metal layer 25c. The fourth lower metal layer 25d is disposed on the fourth lower dielectric layer 24d and electrically connected to the third lower metal layer 25c through the fourth lower via 26d.

The upper structure 3 is stacked on the lower structure 2. The upper structure 3 may be an antenna structure, and has a first surface 31, a second surface 32 opposite to the first surface 31 and a lateral side surface 33 extending between the first surface 31 and the second surface 32. The first surface 31 of the upper structure 3 is in contact with the second surface 22 of the lower structure 2. The upper structure 3 may include at least one upper dielectric layer (including, for example, a first upper dielectric layer 34a and a second upper dielectric layer 34b) and at least one upper metal layer (including, for example, a first upper metal layer 35a, a second upper metal layer 35b and a third upper metal layer 35c) in contact with or interposed between the upper dielectric layers 34a, 34b.

In some embodiments, each of the upper dielectric layers (including, for example, the first upper dielectric layer 34a and the second upper dielectric layer 34b) may include, or be formed from Ajinomoto build-up film (ABF) or ABF-like material. A dielectric constant (Dk) of each of the upper dielectric layers 34a, 34b may be 2.2 to 2.5. Thus, the dielectric constant (Dk) of the lower dielectric layers 24a, 24b, 24c, 24d, 24e is greater than a dielectric constant (Dk) of the upper dielectric layers 34a, 34b. In some embodiments, each of the upper dielectric layers 34a, 34b may include fillers 347, 348 (FIG. 2) dispersed therein.

Each of the upper metal layers 35a, 35b, 35c includes an antenna pattern, and are electrically coupled to one another. In some embodiments, each of the upper metal layers 35a, 35b, 35c does not include a patterned circuit layer (such as a plurality of traces and a plurality of pads), and are not physically connected to one another through any vias. For example, the first upper metal layer 35a is disposed on and attached to the fifth lower dielectric layer 24e of the lower structure 2 and electrically connected to the fourth lower metal layer 25d through the fifth lower via 26e. The first upper dielectric layer 34a is disposed on and attached to the fifth lower dielectric layer 24e of the lower structure 2 to cover the first upper metal layer 35a. The second upper metal layer 35b is disposed on the first upper dielectric layer 34a and electrically coupled to the first upper metal layer 35a. The second upper dielectric layer 34b is disposed on the first upper dielectric layer 34a to cover the second upper metal layer 35b. The third upper metal layer 35c is disposed on the second upper dielectric layer 34b and electrically coupled to the second upper metal layer 35b.

As shown in FIG. 1, the first upper dielectric layer 34a has a top surface 341a, and includes a first portion 344, a second portion 345 and an intermediate portion 346. The second portion 345 surrounds the first portion 344, and the intermediate portion 346 is disposed between the first portion 344 and the second portion 345. However, in some embodiments, intermediate portion 346 may be omitted. As shown in FIG. 1, the top surface 341a is not a flat surface. In some embodiments, the top surface 341a is recessed from a periphery of the top surface 341a since the first upper dielectric layer 34a is formed by at least two compression processes. During the least compression process, the periphery of the top surface 341a is selectively pressed, so as to form the compressed second portion 345.

The lower protection layer 28 (e.g. a solder resist layer) is disposed on the first surface 21 of the lower structure 2 to cover the lower circuit layer 27. The lower protection layer 28 may define a plurality of openings to expose portions of the lower circuit layer 27. In addition, the upper protection layer 29 (e.g. a solder resist layer) is disposed on the second surface 32 of the upper structure 3 to cover the third upper metal layer 35c. In some embodiments, the lower protection layer 28 and the upper protection layer 29 may be omitted.

Figure 2:
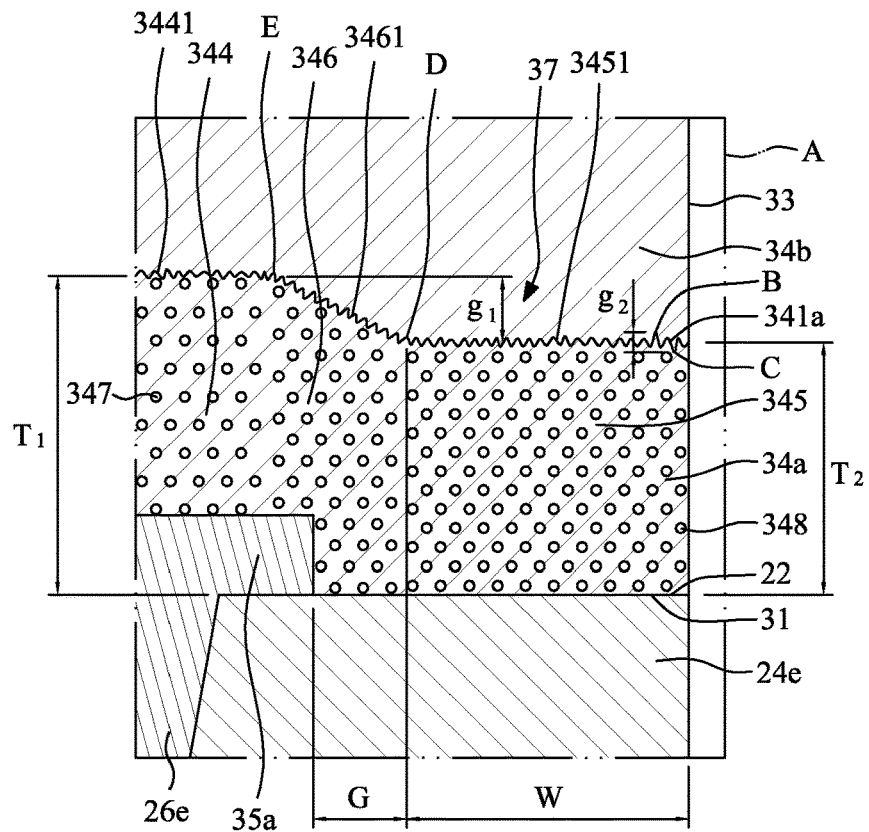
FIG. 2 illustrates an enlarged view of a region "A" in FIG. 1.

FIG. 2 illustrates an enlarged view of a region "A" in FIG. 1. A thickness $T_1$ of the first portion 344 is greater than a thickness $T_2$ of the second portion 345, and the second portion 345 surrounds the first portion 344. Thus, a gap $g_1$ is defined as a difference between the thickness $T_1$ of the first portion 344 and the thickness $T_2$ of the second portion 345 measured along a vertical direction. Further, a gap $g_2$ between a highest point B of the top surface 341a of the first upper dielectric layer 34a and a lowest point C of the top surface 341a of the first upper dielectric layer 34a measured along a vertical direction. The gap $g_1$ is greater than the gap $g_2$. That is, the difference between the thickness $T_1$ of the first portion 344 and the thickness $T_2$ of the second portion 345 is greater than a gap between the highest point B of the top surface 341a of the first upper dielectric layer 34a and the lowest point C of the top surface 341a of the first upper dielectric layer 34a. In some embodiments, the gap $g_1$ may be greater than 1 time, 2 times, 3 times, 4 times, or 5 times the gap $g_2$. In some embodiments, the gap $g_1$ may be in a range of 0.5 µm to 5 µm, or 1.0 µm to 4.8 µm, and the gap $g_2$ may be less than 0.5 µm or 1.0 µm.

As shown in FIG. 2, the first portion 344 is an unpressed portion that has a top surface 3441, the second portion 345 is a pressed portion that has a top surface 3451, and the intermediate portion 346 is a transition portion that has a top surface 3461. The top surface 3461 of the intermediate portion 346 is a slant surface, connects the top surface 3451 of the second portion 345 at point D, and connects the top surface 3441 of the first portion 344 at point E. An edge of the first upper metal layer 35a is disposed under the top surface 3461 of the intermediate portion 346. That is, the first upper metal layer 35a extends to the intermediate portion 346, and does not extend to second portion 345. The first upper metal layer 35a does not extend beyond point D.

As shown in FIG. 2, a gap G is defined as a distance between the edge of the first upper metal layer 35a and the second portion 345 (or the point D) measured along a horizontal direction. A width W of the second portion 345 is defined as distance between the point D and the lateral side surface 33 of the upper structure 3. In some embodiments, the gap G is greater than one third of the width W. For example, the gap G may be in a range of 50 µm to 150 µm, and the width W may be in a range of 100 µm to 150 µm.

As shown in FIG. 2, the first upper dielectric layer 34a may define an indentation 37 at a periphery thereof. For example, the indentation 37 may be defined by the top surface 3461 of the intermediate portion 346 and the top surface 3451 of the second portion 345. A width of an upper portion of the indentation 37 may be equal to or greater than a width of a lower portion of the indentation 37. A depth of the indentation 37 may be equal to the gap $g_1$ that is in a range of 0.5 µm to 5 µm, or 1.0 µm to 4.8 µm.

As shown in FIG. 2, the first upper dielectric layer 34a includes a plurality of first fillers 347 dispersed in the first portion 344 and a plurality of second fillers 348 dispersed in the second portion 345. An average particle size of the first fillers 347 is substantially equal to an average particle size of the second fillers 348. Since the first portion 344 is unpressed and the second portion 345 is pressed, an amount of the first fillers 347 in a first unit area of a cross section of the first portion 344 is less than an amount of the second fillers 348 in a second unit area of a cross section of the second portion 345, wherein a size of the first unit area is equal to a size of the second unit area. That is, the distribution of the second fillers 348 in the second portion 345 is denser than the distribution of the first fillers 347 in the first portion 344.

In the embodiment illustrated in FIG. 1 and FIG. 2, the periphery of the top surface 341a of the first upper dielectric layer 34a is pressed during a compression process; thus, the bonding or adhesion between the first upper dielectric layer 34a of the upper structure 3 and the fifth lower dielectric layer 24e of the lower structure 2 may be improved. As a result, a delamination between the first upper dielectric layer 34a of the upper structure 3 and the fifth lower dielectric layer 24e of the lower structure 2 may be avoided.

Figure 3:
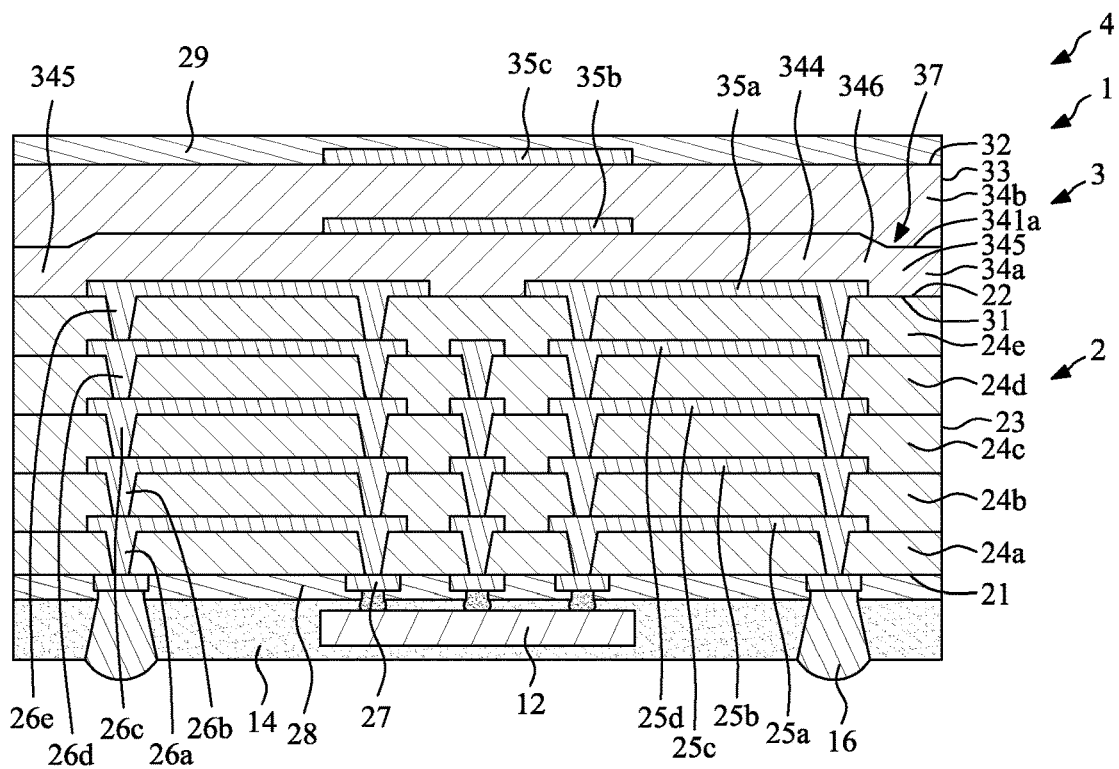
FIG. 3 illustrates a cross-sectional view of a package structure according to some embodiments of the present disclosure.

FIG. 3 illustrates a cross-sectional view of a package structure 4 according to some embodiments of the present disclosure. The package structure 4 includes a stacked structure 1, at least one semiconductor die 12, an encapsulant 14 and a plurality of external connectors 16. The stacked structure 1 of FIG. 3 is similar to the stacked structure 1 of FIG. 1. The semiconductor die 12 may be a radio frequency (RF) die, and is electrically connected to the lower circuit layer 27 on the lower structure 2 through a flip-chip bonding. The encapsulant 14 (e.g., a molding compound) covers the semiconductor die 12, and defines a plurality of openings to expose portions of the lower circuit layer 27. The external connectors 16 are disposed in and fill the openings of the encapsulant 14. The external connectors 16 may extend beyond the encapsulant 14 for external connection.

Figure 4:
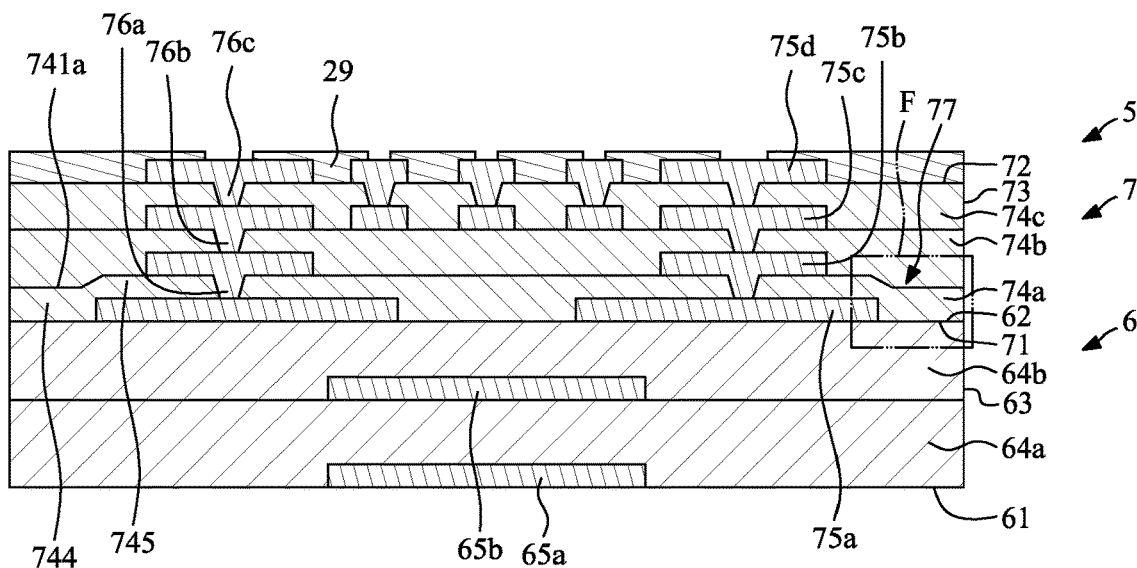
FIG. 4 illustrates a cross-sectional view of a stacked structure according to some embodiments of the present disclosure.

FIG. 4 illustrates a cross-sectional view of a stacked structure 5 according to some embodiments of the present disclosure. The stacked structure 5 includes a lower structure 6, an upper structure 7 and an upper protection layer 29.

The lower structure 6 may be an antenna structure, and has a first surface 61, a second surface 62 opposite to the first surface 61 and a lateral side surface 63 extending between the first surface 61 and the second surface 62. The lower structure 6 may include at least one lower dielectric layer (including, for example, a first lower dielectric layer 64a and a second lower dielectric layer 64b) and at least one lower metal layer (including, for example, a first lower metal layer 65a and a second lower metal layer 65b) in contact with or interposed between the lower dielectric layers 64a, 64b.

In some embodiments, each of the lower dielectric layers (including, for example, the first lower dielectric layer 64a and the second lower dielectric layer 64b) may include, or be formed from Ajinomoto build-up film (ABF) or ABF-like material. A dielectric constant (Dk) of each of the lower dielectric layers 64a, 64b may be 2.2 to 2.5.

Each of the lower metal layers 65a, 65b includes an antenna pattern, and are electrically coupled to one another. In some embodiments, each of the lower metal layers 65a, 65b does not include a patterned circuit layer (such as a plurality of traces and a plurality of pads), and are not physically connected to one another through any vias. The first lower dielectric layer 64a covers the first lower metal layer 65a. The second lower metal layer 65b is disposed on the first lower dielectric layer 64a and electrically coupled to the first lower metal layer 65a. The second lower dielectric layer 64b is disposed on the first lower dielectric layer 64a to cover the second lower metal layer 65b.

The upper structure 7 is stacked on the lower structure 6. The upper structure 7 may be a routing structure, and has a first surface 71, a second surface 72 opposite to the first surface 71 and a lateral side surface 73 extending between the first surface 71 and the second surface 72. The first surface 71 of the upper structure 7 is in contact with the second surface 62 of the lower structure 6. The upper structure 7 may include at least one lower dielectric layer (including, for example, a first upper dielectric layer 74a, a second upper dielectric layer 74b, a third upper dielectric layer 74c), at least one lower metal layer (including, for example, a first upper metal layer 75a, a second upper metal layer 75b, a third upper metal layer 75c, a fourth upper metal layer 75d) in contact with or interposed between the upper dielectric layers 74a, 74b, 74c, and a plurality of upper vias (including, for example, a first upper via 76a, a second upper via 76b, a third upper via 76c) embedded in the upper dielectric layers 74a, 74b, 74c.

In some embodiments, each of the upper dielectric layers (including, for example, the first upper dielectric layer 74a, the second upper dielectric layer 74b, the third upper dielectric layer 74c) may include, or be formed from, a photoresist layer, a passivation layer, a cured photo sensitive material, a cured photoimageable dielectric (PID) material such as epoxy, polypropylene (PP), or polyimide (PI) including photoinitiators, or a combination of two or more thereof. A dielectric constant (Dk) of each of the upper dielectric layers 74a, 74b, 74c may be 3.3 to 3.5. Thus, the dielectric constant (Dk) of the lower dielectric layers 64a, 64b is less than a dielectric constant (Dk) of the upper dielectric layers 74a, 74b, 74c. In some embodiments, each of the upper dielectric layers 74a, 74b, 74c may include fibers therein.

Each of the upper metal layers 75a, 75b, 75c, 75d includes a patterned circuit layer that may include a plurality of traces and a plurality of pads. The upper metal layers 75a, 75b, 75c, 75d are electrically connected to one another through the upper vias (including, for example, the first upper via 76a, the second upper via 76b and the third upper via 76c). For example, the first upper metal layer 75a is disposed on the second lower dielectric layer 64b of the lower structure 6, and is electrically coupled to the second lower metal layer 65b of the lower structure 6. The first upper dielectric layer 74a is disposed on and attached to the second lower dielectric layer 64b of the lower structure 6 to cover the first upper metal layer 75a. The second upper metal layer 75b is disposed on the first upper dielectric layer 74a and electrically connected to the first upper metal layer 75a through the first upper via 76a. The second upper dielectric layer 74b is disposed on and attached to the first upper dielectric layer 74a to cover the second upper metal layer 75b. The third upper metal layer 75c is disposed on the second upper dielectric layer 74b and electrically connected to the second upper metal layer 75b through the second upper via 76b. The third upper dielectric layer 74c is disposed on the second upper dielectric layer 74b to cover the third upper metal layer 75c. The fourth upper metal layer 75d is disposed on the third upper dielectric layer 74c and electrically connected to the third upper metal layer 75c through the third upper via 76c.

As shown in FIG. 4, the first upper dielectric layer 74a includes a base portion 744 and a protrusion portion 745 protruding from the base portion 744 to define an indentation 77. The indentation 77 surrounds the protrusion portion 745. As shown in FIG. 4, the top surface 741a of the first upper dielectric layer 74a is not a flat surface. In some embodiments, the top surface 741a is recessed from a periphery of the top surface 741a since the first upper dielectric layer 74a is formed by at least two compression processes. During the least compression process, the periphery of the top surface 741a is selectively pressed, so as to form the indentation 77.

The upper protection layer 29 (e.g. a solder resist layer) is disposed on the second surface 72 of the upper structure 7 to cover the fourth upper metal layer 75d. The upper protection layer 29 may define a plurality of openings to expose portions of the fourth upper metal layer 75d. In some embodiments, the upper protection layer 29 may be omitted.

Figure 5:
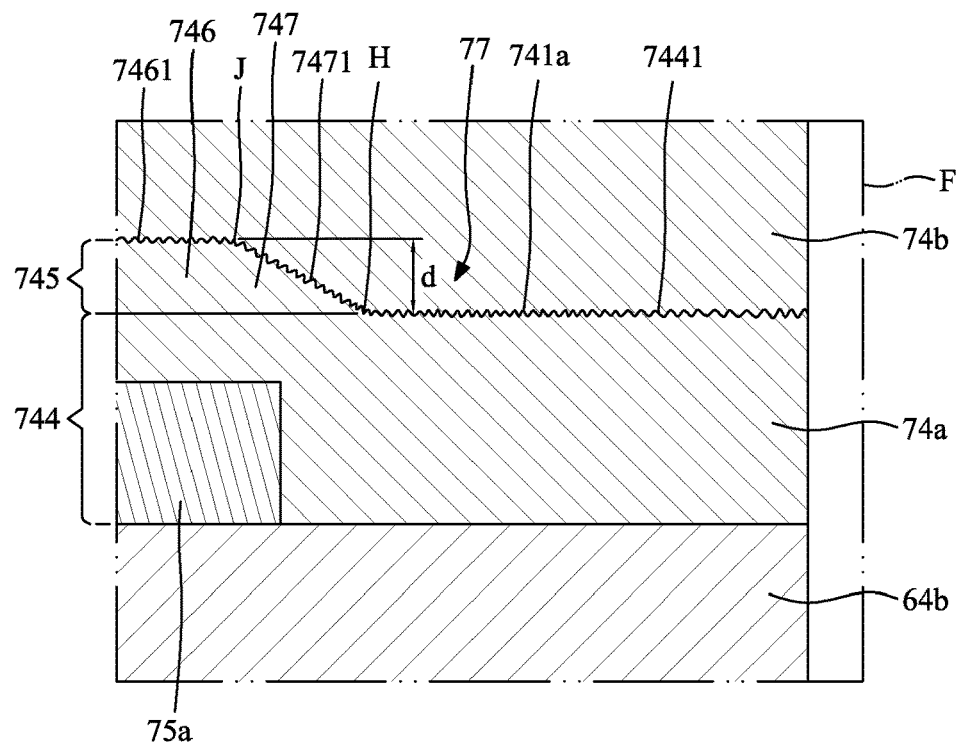
FIG. 5 illustrates an enlarged view of a region "F" in FIG. 4.

FIG. 5 illustrates an enlarged view of a region "F" in FIG. 4. The base portion 744 has a top surface 7441. The protrusion portion 745 includes a central portion 746 and a peripheral portion 747. The central portion 746 has a top surface 7461, and the peripheral portion 747 has a top surface 7471. The top surface 7471 of the peripheral portion 747 is a slant surface, connects the top surface 7441 of the base portion 744 at point H, and connects the top surface 7461 of the central portion 746 at point J. A depth d of the indentation 77 is defined as a gap between the top surface 7461 of the central portion 746 and the top surface 7441 of the base portion 744 measured along a vertical direction. The depth d is greater than a gap between the highest point of the top surface 7441 of the base portion 744 and the lowest point of the top surface 7441 of the base portion 744. In some embodiments, the depth d of the indentation 77 may be in a range of 0.5 µm to 5 µm, or 1.0 µm to 4.8 µm, or 0.5 µm to 2.0 µm.

As shown in FIG. 5, an edge of the first upper metal layer 75a is disposed under the top surface 7471 of the peripheral portion 747. That is, the first upper metal layer 75a extends to a position under the peripheral portion 747. The first upper metal layer 75a does not extend beyond point H. In addition, the structure of the indentation 77 may be same as or different from the indentation 37 of FIG. 1 and FIG. 2. For example, the indentation 77 may be defined by the top surface 7471 of the peripheral portion 747 and the top surface 7441 of the base portion 744. A width of an upper portion of the indentation 77 may be equal to or greater than a width of a lower portion of the indentation 77.

Figure 6:
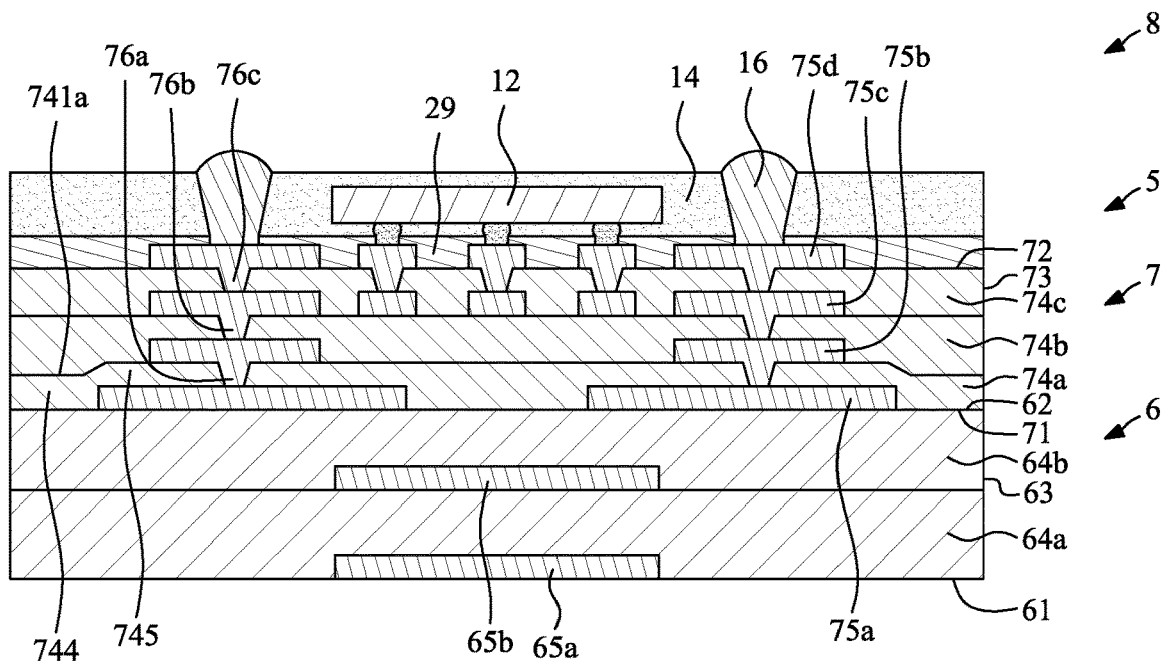
FIG. 6 illustrates a cross-sectional view of a package structure according to some embodiments of the present disclosure.

FIG. 6 illustrates a cross-sectional view of a package structure 8 according to some embodiments of the present disclosure. The package structure 8 includes a stacked structure 5, at least one semiconductor die 12, an encapsulant 14 and a plurality of external connectors 16. The stacked structure 5 of FIG. 6 is similar to the stacked structure 5 of FIG. 4. The semiconductor die 12 may be a radio frequency (RF) die, and is electrically connected to the fourth upper metal layer 75d of the upper structure 7 through a flip-chip bonding. The encapsulant 14 (e.g., a molding compound) covers the semiconductor die 12, and defines a plurality of openings to expose portions of the fourth upper metal layer 75d. The external connectors 16 are disposed in and fill the openings of the encapsulant 14. The external connectors 16 may extend beyond the encapsulant 14 for external connection.

FIG. 7 through FIG. 11 illustrate a method for manufacturing a stacked structure according to some embodiments of the present disclosure. In some embodiments, the method is for manufacturing the stacked structure 1 shown in FIG. 1.

Figure 7:
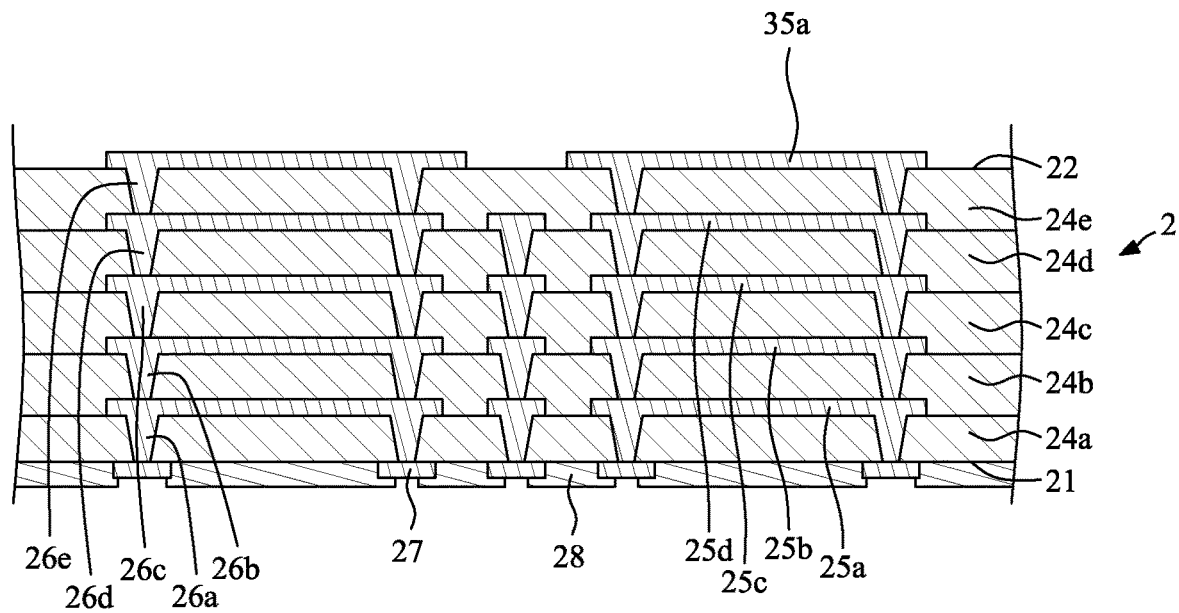
FIG. 7 illustrates one or more stages of an example of a method for manufacturing a stacked structure according to some embodiments of the present disclosure.

Referring to FIG. 7, a lower structure 2 is provided or formed. The lower structure 2 may include at least one lower dielectric layer (including, for example, a first lower dielectric layer 24a, a second lower dielectric layer 24b, a third lower dielectric layer 24c, a fourth lower dielectric layer 24d and a fifth lower dielectric layer 24e), at least one lower metal layer (including, for example, a first lower metal layer 25a, a second lower metal layer 25b, a third lower metal layer 25c, a fourth lower metal layer 25d) in contact with or interposed between the lower dielectric layers 24a, 24b, 24c, 24d, 24e, and a plurality of lower vias (including, for example, a first lower via 26a, a second lower via 26b, a third lower via 26c, a fourth lower via 26d and a fifth lower via 26e) embedded in the lower dielectric layers 24a, 24b, 24c, 24d, 24e. Then, a first upper metal layer 35a is formed or disposed on the fifth lower dielectric layer 24e of the lower structure 2. The first upper metal layer 35a is electrically connected to the fourth lower metal layer 25d through the fifth lower via 26e.

Figure 8:
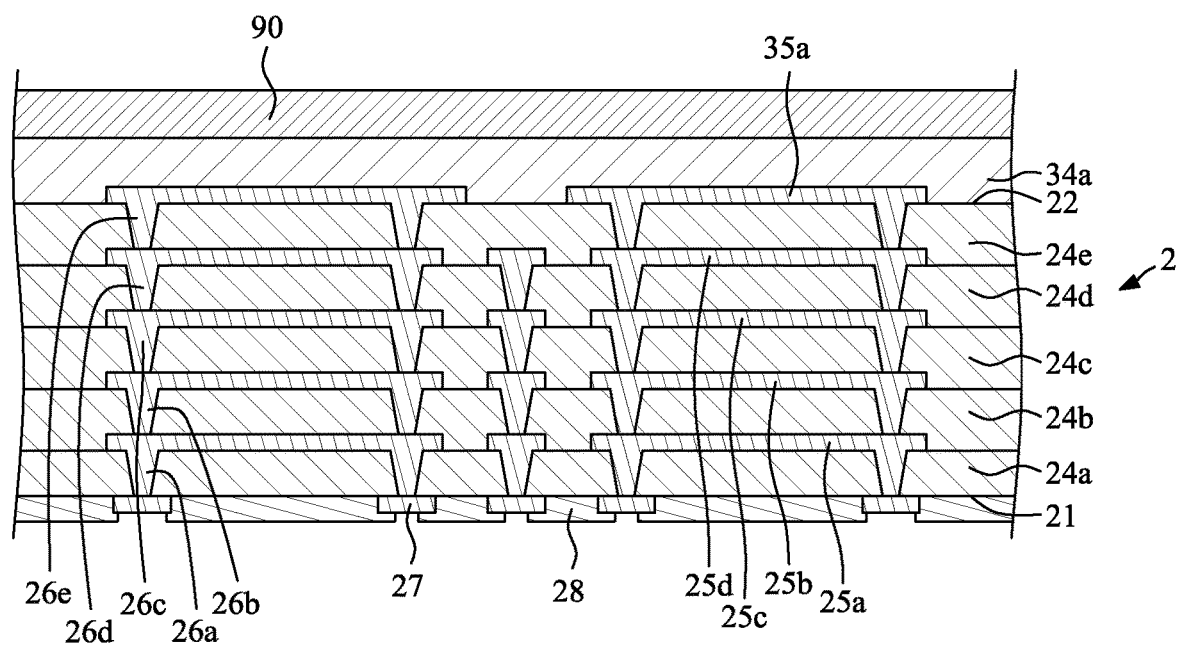
FIG. 8 illustrates one or more stages of an example of a method for manufacturing a stacked structure according to some embodiments of the present disclosure.

Referring to FIG. 8, a first upper dielectric layer 34a is formed or disposed on the fifth lower dielectric layer 24e of the lower structure 2 to cover the first upper metal layer 35a. Then, the first upper dielectric layer 34a is conducted by a first compression process through a first press tool 90. In some embodiments, the first press tool 90 may be a solid steel plate or a solid steel stencil. The entire bottom surface of the first press tool 90 contacts the entire top surface of the first upper dielectric layer 34a so as to press the whole first upper dielectric layer 34a to the lower structure 2.

Figure 9:
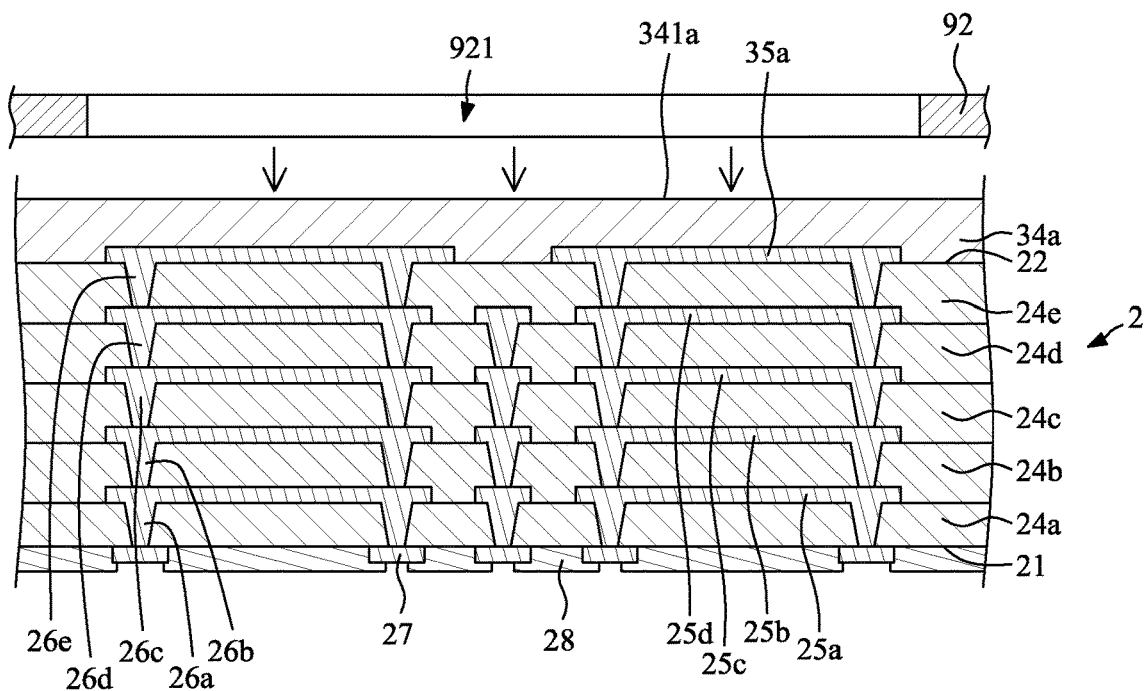
FIG. 9 illustrates one or more stages of an example of a method for manufacturing a stacked structure according to some embodiments of the present disclosure.

Referring to FIG. 9, the first press tool 90 is removed. Then, a second press tool 92 is provided. In some embodiments, the second press tool 92 may be a solid steel plate or a solid steel stencil, and may define a central hole 921. In some embodiments, the second press tool 92 may be a metal ring structure from a top view.

Figure 10:
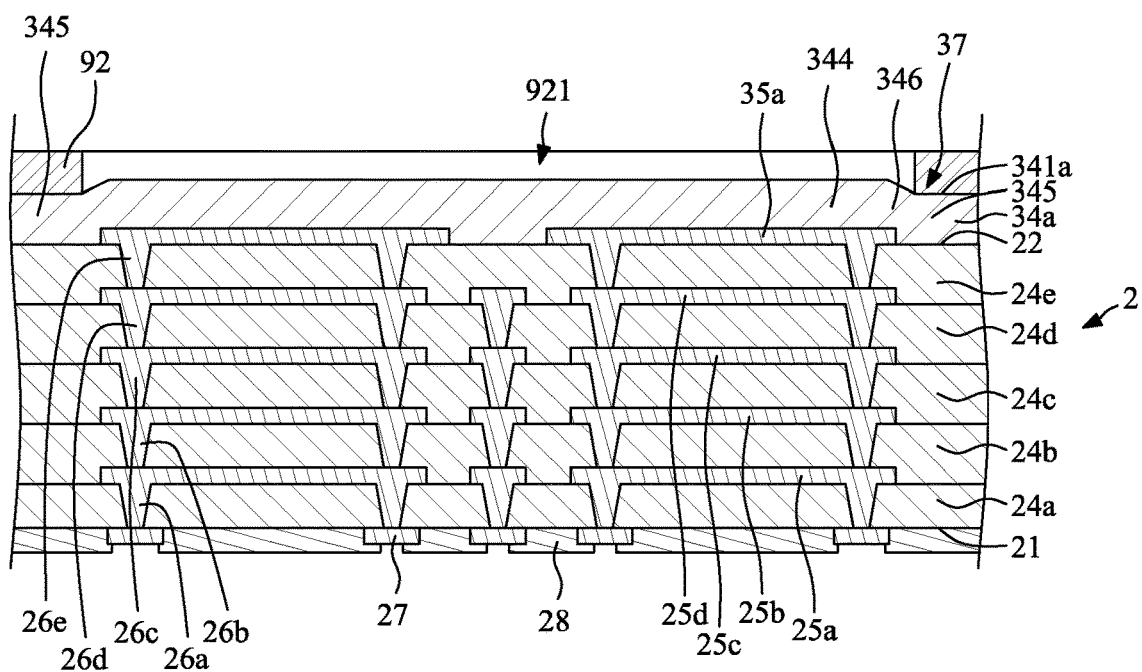
FIG. 10 illustrates one or more stages of an example of a method for manufacturing a stacked structure according to some embodiments of the present disclosure.

Referring to FIG. 10, the first upper dielectric layer 34a is conducted by a second compression process. Meanwhile, the second press tool 92 is applied to the top surface 341a of the first upper dielectric layer 34a, thus, a portion of the first upper dielectric layer 34a corresponding to the solid portion of the second press tool 92 is pressed, so as to form an indentation 37 recessed from the top surface 341a of the first upper dielectric layer 34a. In some embodiments, the indentation 37 is disposed at a periphery of the first upper dielectric layer 34a.

As shown in FIG. 10, the first upper dielectric layer 34a includes an unpressed first portion 344, a pressed second portion 345 and an intermediate portion 346. The second portion 345 surrounds the first portion 344, and the intermediate portion 346 is disposed between the first portion 344 and the second portion 345. However, in some embodiments, intermediate portion 346 may be omitted. The top surface 341a is not a flat surface. In other words, the first upper dielectric layer 34a may include a base portion (e.g., the base portion 744 of FIG. 4) and a protrusion portion (e.g., the protrusion portion 745 of FIG. 4) protruding from the base portion to define the indentation 37 (e.g. the indentation 77 of FIG. 4).

It is noted that the solid portion of the second press tool 92 may not press the first upper metal layer 35a. That is, the first upper metal layer 35a is disposed outside the pressed second portion 345 of the first upper dielectric layer 34a.

In some embodiments, the total press force applied to the first press tool 90 during the first compression process is equal to the total press force applied to the second press tool 92 during the second compression process. However, the contact area between the second press tool 92 and the top surface 341a of the first upper dielectric layer 34a is smaller than the contact area between the first press tool 90 and the top surface 341a of the first upper dielectric layer 34a. Thus, the indentation 37 may be formed.

Figure 11:
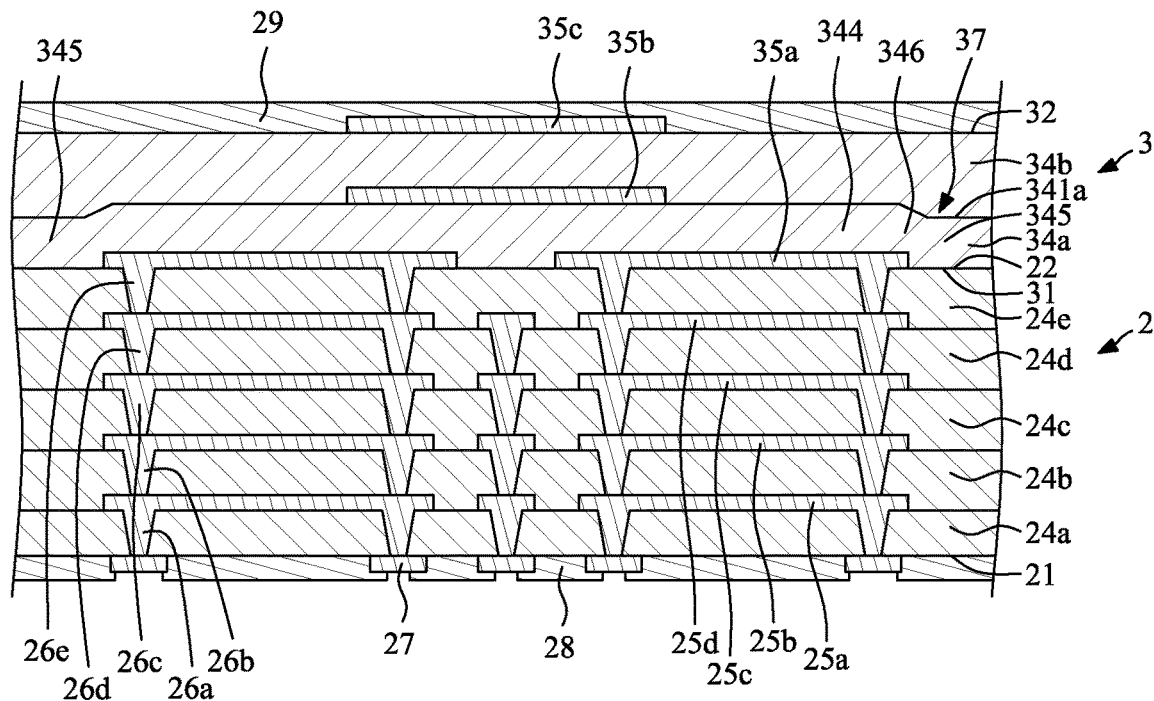
FIG. 11 illustrates one or more stages of an example of a method for manufacturing a stacked structure according to some embodiments of the present disclosure.

Referring to FIG. 11, the second press tool 92 is removed. Then, a second upper metal layer 35b is formed or disposed on the first upper dielectric layer 34a. Then, a second upper dielectric layer 34b is formed or disposed on the first upper dielectric layer 34a to cover the second upper metal layer 35b and extends into the indentation 37. Then, a third upper metal layer 35c is formed or disposed on the second upper dielectric layer 34b. Meanwhile, an upper structure 3 is formed. The upper structure 3 may be an antenna structure, and has a first surface 31 and a second surface 32 opposite to the first surface 31.

Then, an upper protection layer 29 is formed or disposed on the second surface 32 of the upper structure 3 to cover the third upper metal layer 35c.

Then, a singulation process is conducted to obtain a plurality of stacked structures 1 of FIG. 1.

FIG. 12 through FIG. 21 illustrate a method for manufacturing a stacked structure according to some embodiments of the present disclosure. In some embodiments, the method is for manufacturing the stacked structure 5 shown in FIG. 4.

Figure 12:
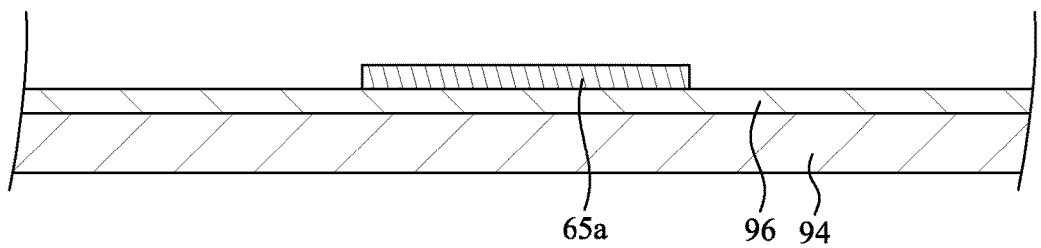
FIG. 12 illustrates one or more stages of an example of a method for manufacturing a stacked structure according to some embodiments of the present disclosure.

Referring to FIG. 12, a carrier 94 with a release film 96 is provided. Then, a first lower metal layer 65a is formed on the release film 96 on the carrier 94.

Figure 13:
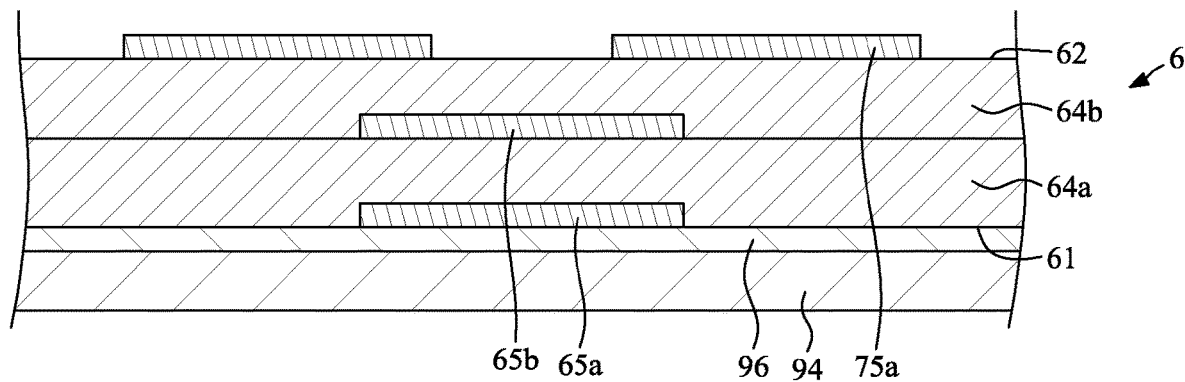
FIG. 13 illustrates one or more stages of an example of a method for manufacturing a stacked structure according to some embodiments of the present disclosure.

Referring to FIG. 13, a first lower dielectric layer 64a is formed or disposed to cover the first lower metal layer 65a. Then, a second lower metal layer 65b is formed or disposed on the first lower dielectric layer 64a. Then, a second lower dielectric layer 64b is formed or disposed on the first lower dielectric layer 64a to cover the second lower metal layer 65b. Meanwhile, a lower structure 6 is formed. In addition, a first upper metal layer 75a is formed or disposed on the second lower dielectric layer 64b.

Figure 14:
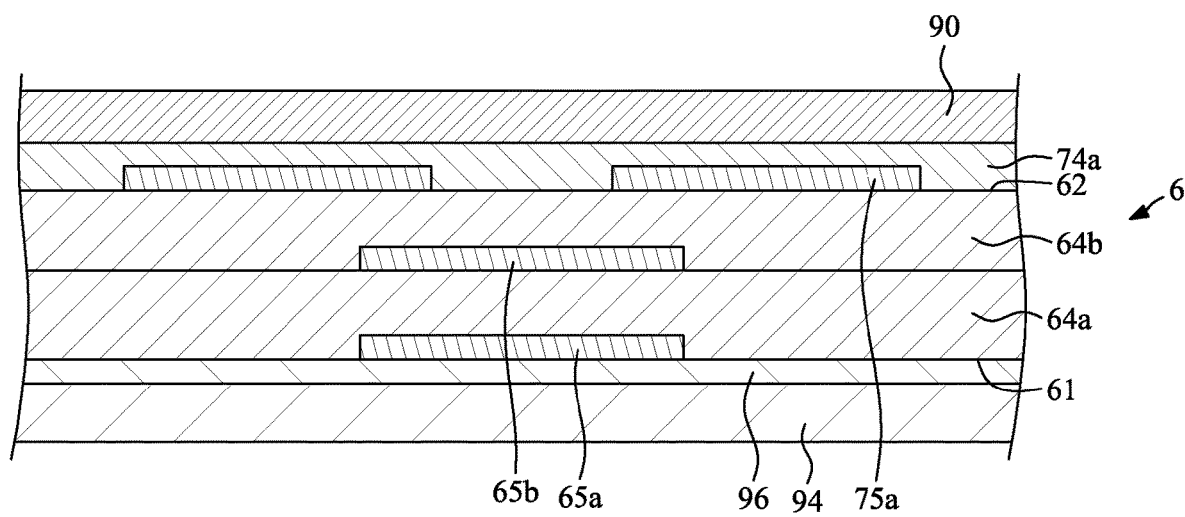
FIG. 14 illustrates one or more stages of an example of a method for manufacturing a stacked structure according to some embodiments of the present disclosure.

Referring to FIG. 14, a first upper dielectric layer 74a is formed or disposed on the second lower dielectric layer 64b to cover the first upper metal layer 75a. Then, the first upper dielectric layer 74a is conducted by a first compression process through a first press tool 90. In some embodiments, the first press tool 90 may be a solid steel plate or a solid steel stencil. The entire bottom surface of the first press tool 90 contacts the entire top surface of the first upper dielectric layer 74a so as to press the whole first upper dielectric layer 74a to the lower structure 6.

Figure 15:
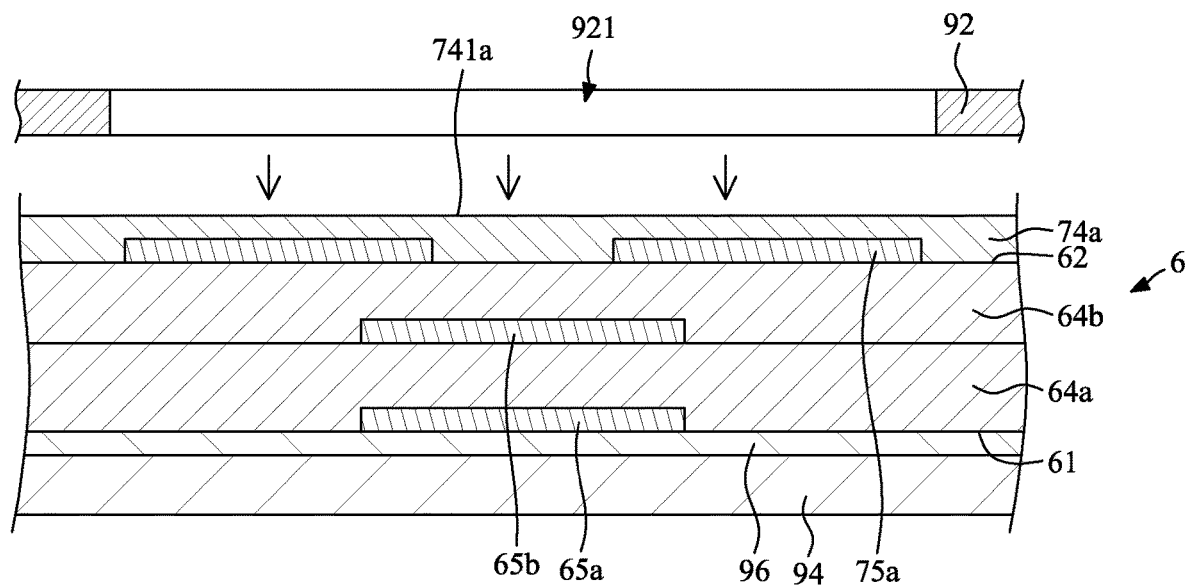
FIG. 15 illustrates one or more stages of an example of a method for manufacturing a stacked structure according to some embodiments of the present disclosure.

Referring to FIG. 15, the first press tool 90 is removed. Then, a second press tool 92 is provided. In some embodiments, the second press tool 92 may be a solid steel plate or a solid steel stencil, and may define a central hole 921. In some embodiments, the second press tool 92 may be a metal ring structure from a top view.

Figure 16:
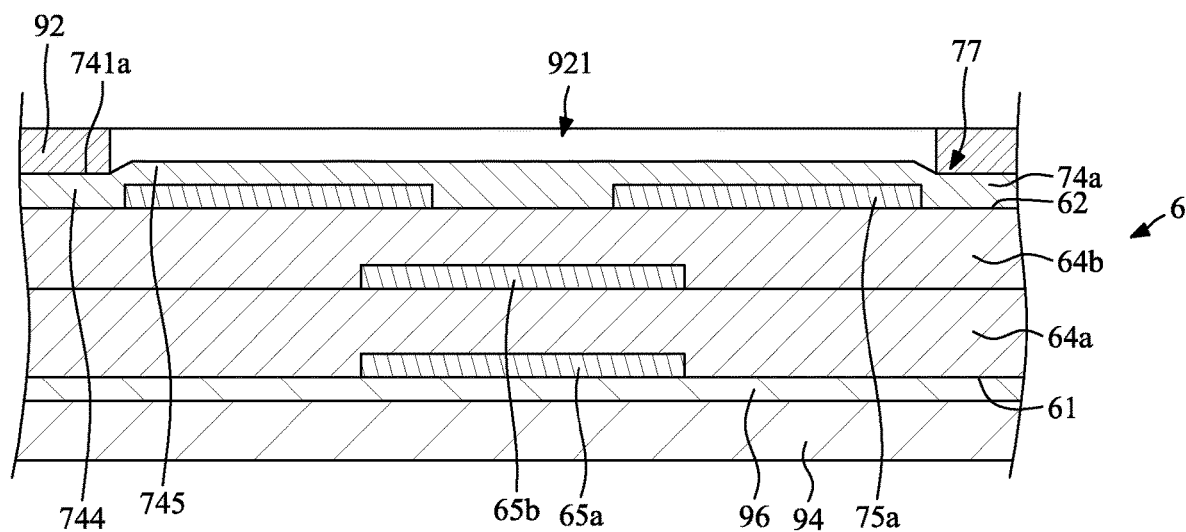
FIG. 16 illustrates one or more stages of an example of a method for manufacturing a stacked structure according to some embodiments of the present disclosure.

Referring to FIG. 16, the first upper dielectric layer 74a is conducted by a second compression process. Meanwhile, the second press tool 92 is applied to the top surface 741a of the first upper dielectric layer 74a, thus, a portion of the first upper dielectric layer 74a corresponding to the solid portion of the second press tool 92 is pressed, so as to form an indentation 77 recessed from the top surface 741a of the first upper dielectric layer 74a.

Figure 17:
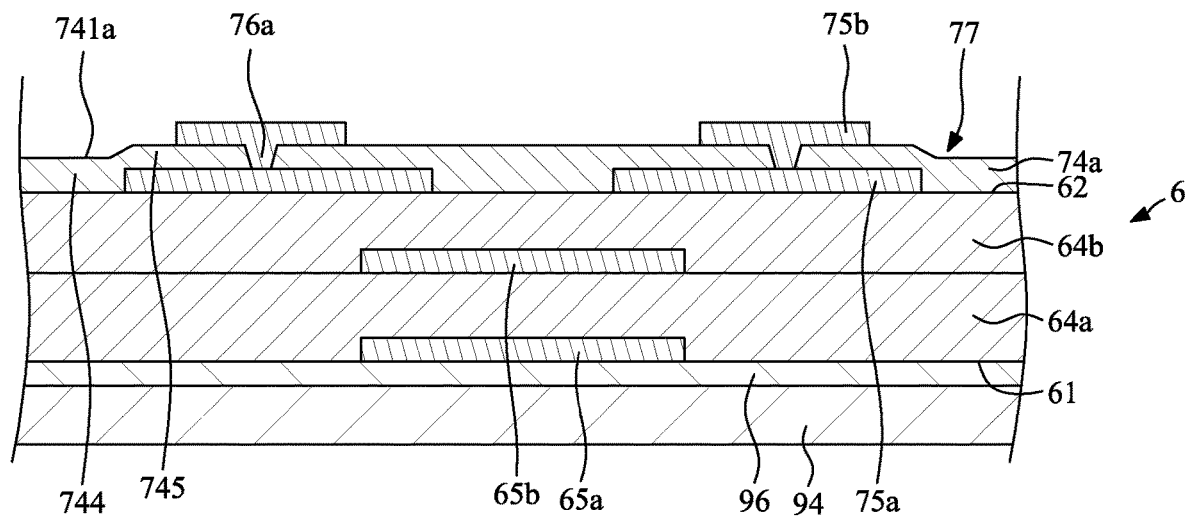
FIG. 17 illustrates one or more stages of an example of a method for manufacturing a stacked structure according to some embodiments of the present disclosure.

Referring to FIG. 17, the second press tool 92 is removed.

Figure 18:
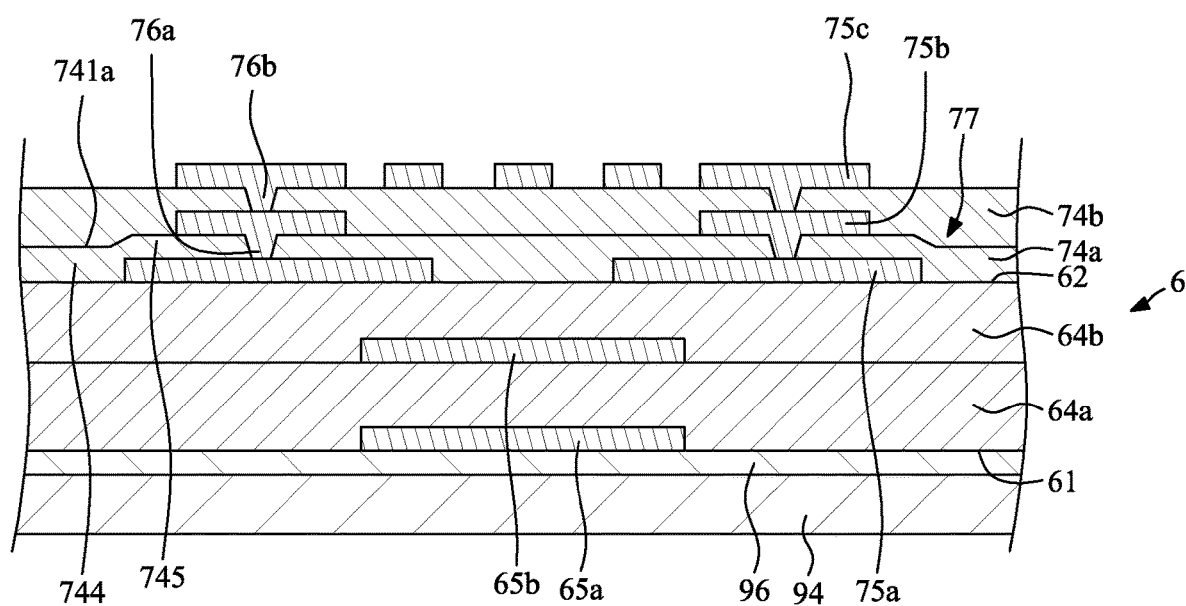
FIG. 18 illustrates one or more stages of an example of a method for manufacturing a stacked structure according to some embodiments of the present disclosure.

Referring to FIG. 18, a second upper metal layer 75b is formed or disposed on the first upper dielectric layer 74a. Then, a second upper dielectric layer 74b is formed or disposed on the first upper dielectric layer 74a to cover the second upper metal layer 75b and extends into the indentation 77. Then, a third upper metal layer 75c is formed or disposed on the second upper dielectric layer 74b.

Figure 19:
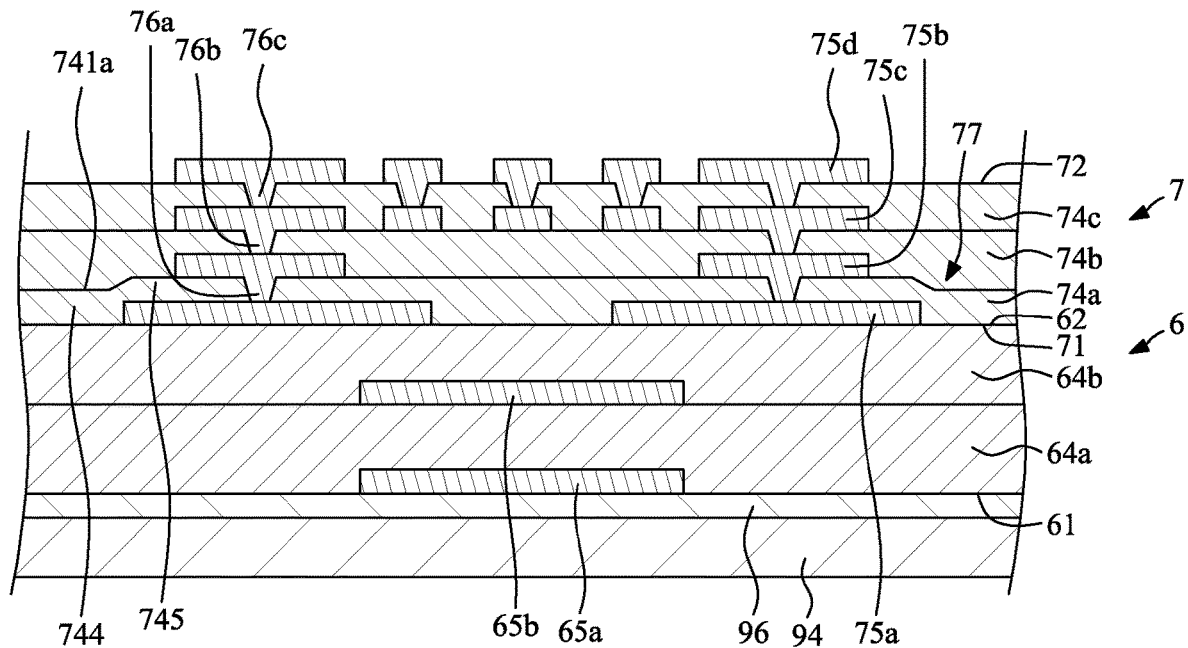
FIG. 19 illustrates one or more stages of an example of a method for manufacturing a stacked structure according to some embodiments of the present disclosure.

Referring to FIG. 19, a third upper dielectric layer 74c is formed or disposed on the second upper dielectric layer 74b to cover the third upper metal layer 75c. Then, a fourth upper metal layer 75d is formed or disposed on the third upper dielectric layer 74c. Meanwhile, an upper structure 7 is formed.

Figure 20:
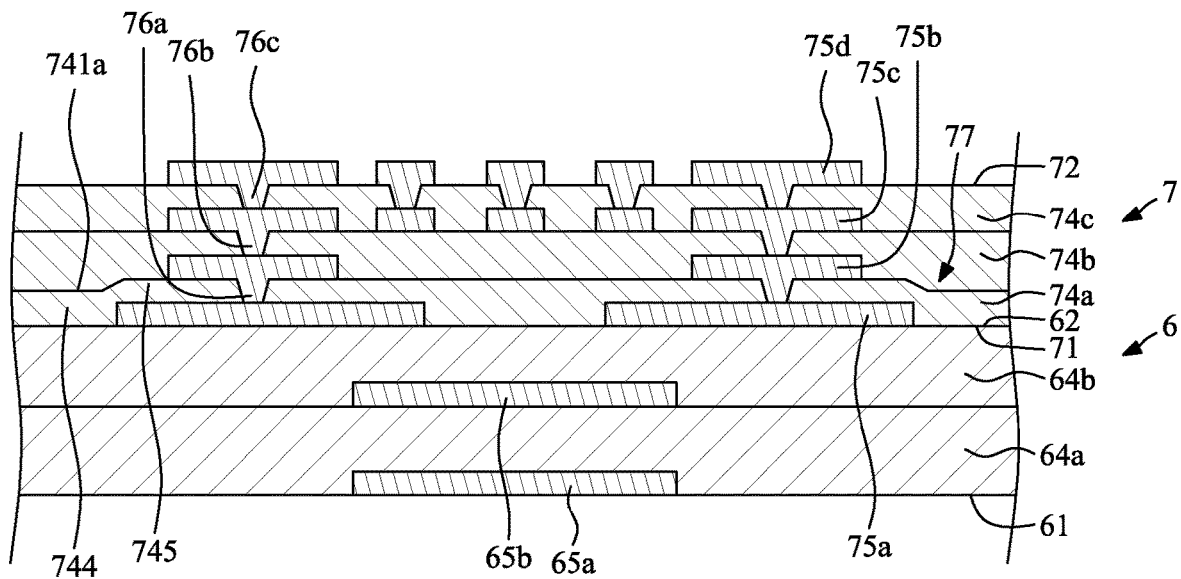
FIG. 20 illustrates one or more stages of an example of a method for manufacturing a stacked structure according to some embodiments of the present disclosure.

Referring to FIG. 20, the carrier 94 with the release film 96 is removed.

Figure 21:
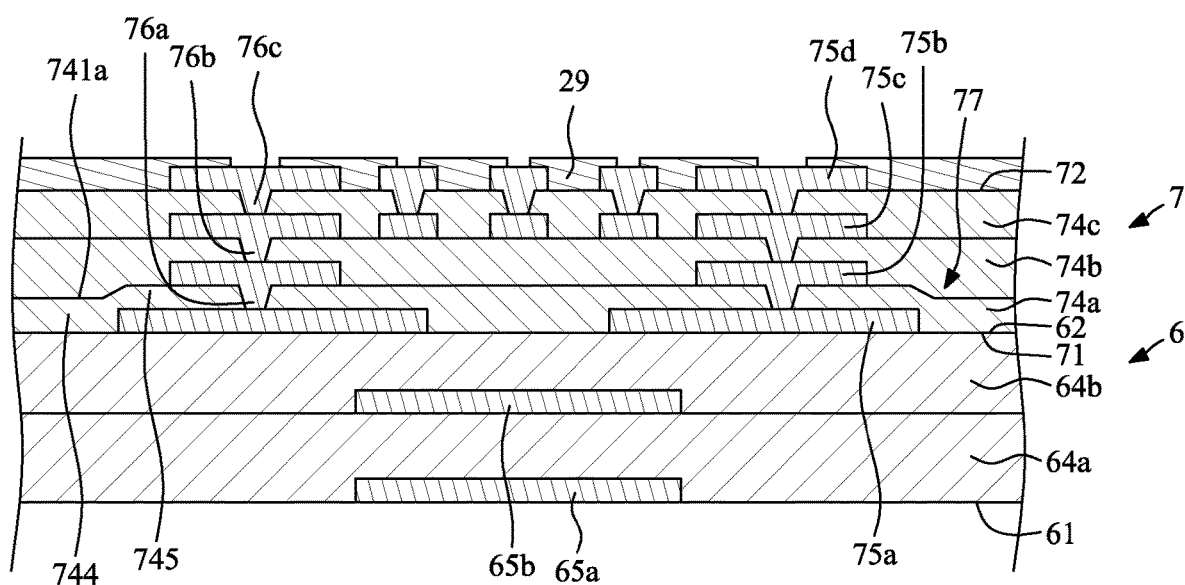
FIG. 21 illustrates one or more stages of an example of a method for manufacturing a stacked structure according to some embodiments of the present disclosure.

Referring to FIG. 21, an upper protection layer 29 is formed or disposed on the second surface 72 of the upper structure 7 to cover the fourth upper metal layer 75d. The upper protection layer 29 may define a plurality of openings to expose portions of the fourth upper metal layer 75d.

Then, a singulation process is conducted to obtain a plurality of stacked structures 5 of FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ≅10% of that numerical value, such as less than or equal to ≅5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A stacked structure, comprising:
a lower structure including at least one lower dielectric layer and at least one lower metal layer in contact with the lower dielectric layer; and
an upper structure including at least one upper dielectric layer and at least one upper metal layer in contact with the upper dielectric layer, wherein the at least one upper dielectric layer includes a first upper dielectric layer attached to the lower structure, the first upper dielectric layer includes a first portion and a second portion, the first upper dielectric layer includes a plurality of first fillers dispersed in the first portion and a plurality of second fillers dispersed in the second portion, an average particle size of the first fillers is substantially equal to an average particle size of the second fillers, an amount of the first fillers in a first unit area of a cross section of the first portion is less than an amount of the second fillers in a second unit area of a cross section of the second portion, and a size of the first unit area is equal to a size of the second unit area, wherein a difference between a thickness of the first portion and a thickness of the second portion is greater than a gap between a highest point of a top surface of the first upper dielectric layer and a lowest point of the top surface of the first upper dielectric layer.

2. The stacked structure of claim 1, wherein the lower structure is a routing structure, and includes a plurality of lower dielectric layers and a plurality of lower metal layers interposed between the lower dielectric layers, each of the lower metal layers includes a patterned circuit layer, the lower metal layers are electrically connected to one another through a plurality of lower vias; wherein the upper structure is an antenna structure, and the at least one upper metal layer includes an antenna pattern.

3. The stacked structure of claim 1, wherein the lower structure is an antenna structure, and the at least one lower metal layer includes an antenna pattern; wherein the upper structure is a routing structure, and includes a plurality of upper dielectric layers and a plurality of upper metal layers interposed between the upper dielectric layers, each of the upper metal layers includes a patterned circuit layer, the upper metal layers are electrically connected to one another through a plurality of upper vias.

4. The stacked structure of claim 1, wherein a dielectric constant (Dk) of the at least one lower dielectric layer is greater than a dielectric constant (Dk) of the at least one upper dielectric layer.

5. The stacked structure of claim 1, wherein a dielectric constant (Dk) of the at least one lower dielectric layer is less than a dielectric constant (Dk) of the at least one upper dielectric layer.

6. The stacked structure of claim 1, wherein a thickness of the first portion is greater than a thickness of the second portion, and the second portion surrounds the first portion.

7. The stacked structure of claim 1, wherein the second portion is formed by at least two compression processes.

8. The stacked structure of claim 1, wherein the at least one upper metal layer includes a first upper metal layer attached to the lower structure, the first upper dielectric layer covers the first upper metal layer, and the first upper metal layer does not extend to the second portion.

9. The stacked structure of claim 1, wherein the at least one upper dielectric layer further includes a second upper dielectric layer disposed on the first upper dielectric layer, the at least one upper metal layer includes a first upper metal layer, a second upper metal layer and a third upper metal layer, wherein the first upper metal layer is disposed on the lower structure, the first upper dielectric layer covers the first upper metal layer, the second upper metal layer is disposed on the first upper dielectric layer, the second upper dielectric layer covers the second upper metal layer, and the third upper metal layer is disposed on the second upper dielectric layer.

* * * * *